US008819612B1

(12) United States Patent
Helvey

(10) Patent No.: US 8,819,612 B1
(45) Date of Patent: Aug. 26, 2014

(54) ANALYZING TIMING REQUIREMENTS OF A HIERARCHICAL INTEGRATED CIRCUIT DESIGN

(71) Applicant: International Business Machines Corporation, Armonk, NY (US)

(72) Inventor: Timothy D. Helvey, Rochester, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/845,931

(22) Filed: Mar. 18, 2013

(51) Int. Cl.
*G06F 17/50* (2006.01)

(52) U.S. Cl.
USPC .......................................... 716/132; 716/139

(58) Field of Classification Search
CPC .......... G06F 17/50; G06F 9/455; G06F 15/04
USPC ................................................ 716/132, 139
See application file for complete search history.

(56) References Cited

U.S. PATENT DOCUMENTS

| 6,834,376 | B2 | 12/2004 | Wada |
| 7,080,365 | B2 | 7/2006 | Broughton et al. |
| 7,657,547 | B1 | 2/2010 | Huitema |
| 7,941,774 | B2 * | 5/2011 | Luan et al. ............ 716/113 |
| 8,020,120 | B2 | 9/2011 | Heng et al. |
| 2012/0159417 | A1 | 6/2012 | Drumm et al. |
| 2012/0303671 | A1 | 11/2012 | Chowdhury |

FOREIGN PATENT DOCUMENTS

JP  2003044533 A  2/2003

\* cited by examiner

*Primary Examiner* — Thuan Do
(74) *Attorney, Agent, or Firm* — Joseph F. Gravert; James R. Nock

(57) ABSTRACT

Logic gates in a child unit of a hierarchical integrated circuit design that are visible in an abstract model of the child unit of the hierarchical integrated circuit design are marked. A hide bit is set for the marked logic gates and a modification on the child unit is performed. The marked logic gates in the child unit are preserved during modification of the child unit. The hide bit is cleared from each marked logic gate and the logic gates are unmarked when modification of the child unit is complete.

20 Claims, 7 Drawing Sheets

ANALYZING TIMING REQUIREMENTS OF A HIERARCHICAL INTEGRATED CIRCUIT DESIGN

FIELD OF THE INVENTION

The present invention relates generally to integrated circuits, and more specifically, regards satisfying the timing requirements of boundary paths of integrated circuit designs.

BACKGROUND

As the size of integrated circuit designs grow rapidly, synthesis of very large flat designs becomes expensive and time-consuming. The traditional way of dealing with these problems is through the introduction of hierarchy in the designs. Hierarchical designs can be created such that the individual pieces of the hierarchy are of a good size for synthesis and the number of pieces in the hierarchy is proportional to the size of the designs. Synthesis can be run separately on each piece of the hierarchy, and these jobs can be run in parallel to reduce the total run time. With hierarchical logic design, logic paths often span from one physical unit to another. The lower units of the hierarchy are referred to as children and the higher units are referred to as the parent. It is a common task to create a timing budget for each unit and initially apportion time between interconnected units so that the individuals or teams designing different units can design those units to meet expected timing constraints for the overall design.

SUMMARY

Disclosed herein are embodiments of a method for analyzing timing requirements of a hierarchical integrated circuit design. In one embodiment, a method includes an operation in which each logic gate in a child unit of the hierarchical integrated circuit design that is visible in an abstract model of the child unit of the hierarchical integrated circuit design is marked. In addition, the method may include preserving each marked logic gate in the child unit during modification of the child unit.

Also disclosed herein are embodiments of a system for analyzing timing requirements of a hierarchical integrated circuit design. In one embodiment, a system includes a netlist of logic gates associated with a child unit of the hierarchical integrated circuit design, at least some of the logic gates marked. In addition, the system may include an abstract generation tool for generating an abstract of the hierarchical integrated circuit design, the abstract generation tool adapted to mark each logic gate in the netlist that should be kept for the abstract. Furthermore, the system may include a modification tool in communication with the abstract generation tool, the modification tool adapted to preserve each marked logic gate in the child unit during modification of the child unit.

Also disclosed herein are embodiments of a computer-readable storage medium encoded with instructions for analyzing timing requirements of a hierarchical integrated circuit design. In one embodiment, a computer-readable storage medium includes instructions for marking each logic gate in a child unit of the hierarchical integrated circuit design that is visible in an abstract model of the child unit of the hierarchical integrated circuit design. In addition, the computer-readable storage medium may include instructions for preserving each marked logic gate in the child unit during modification of the child unit.

DETAILED DESCRIPTION

Figure 1:
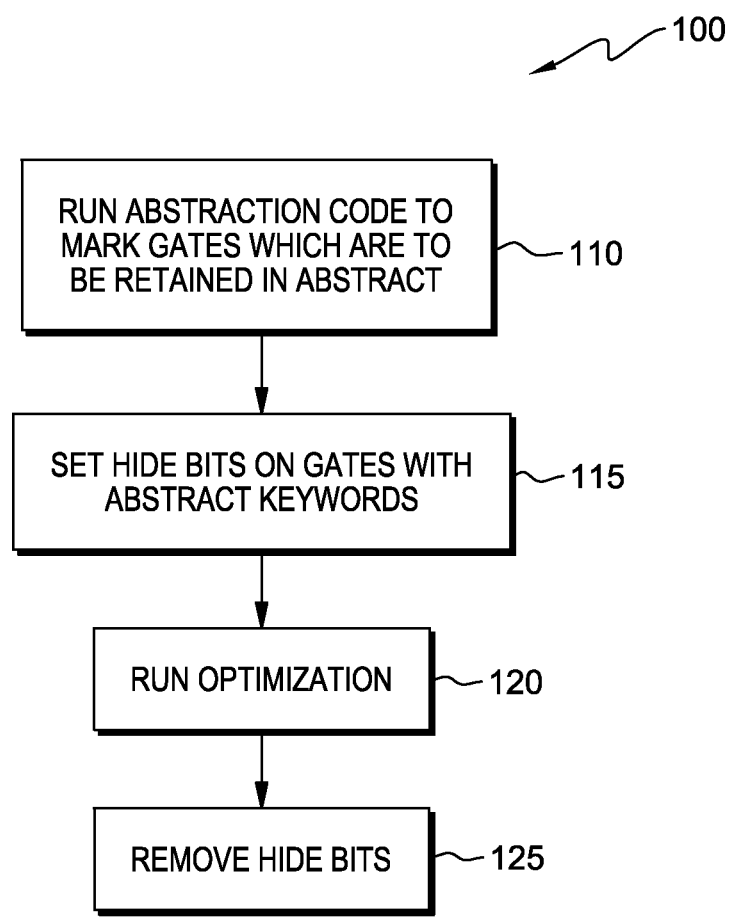
FIG. 1 is a high-level flow diagram of an example method for analyzing timing requirements of a hierarchical integrated circuit design.

The proliferation of modern electronics is due in large part to the development of the integrated circuit. Integrated circuits allow many different circuit elements to be implemented on a single microchip. As technology advances, the number of circuit elements on a microchip continues to increase, which enhances the performance and reduces the cost of integrated circuits.

Integrated circuit design is sub-divided into at least two categories: flat design methodology and hierarchical circuit design. Flat design methodology is ideal for straightforward circuit design with low logic gate counts. The design flow may be done in two incremental steps: logical design and physical design. In most cases, the physical design can only be considered once the logical design is complete. As more complex circuit designs are attempted, the time required to simulate the execution of the circuit increases and these simulations have to be repeated before a satisfactory design is achieved. Furthermore, flat design methodology is not partitioned easily in terms of layout, placement, or testing and the logic gate quantity of various pieces of equipment used in circuit design means that partitioning is becoming increasingly important.

There is an upsurge in the use of hierarchical circuit design as designs have combined several chips into one system on chip (SOC) device. For projects to be successful, designs must be planned carefully for integrated circuit design times and specifications to be met. The design can be partitioned and shared amongst a team of engineers and consideration may be given to the different areas, such as software design, compiler size limitations, test equipment and completing timing requirements.

Tighter timing specifications resulting from the use of fast embedded processors, complex, high logic gate counts, and sub-micron integrated circuit designs have produced new challenges for designers and engineers. An advantage of hierarchical design over flat design methodology is that it is better able to overcome these problems and achieve successful timing specifications. Engineers may use syntheses tools with built in placement algorithms that give accurate timing predictions of the placed and routed design.

Hierarchical design takes advantage of these accurate timing predictions by dividing the integrated circuit design into sub-sections. These sub-sections are referred to as child units.

The child units consist of both internal paths and boundary paths. An assortment of logic gates lie along both set of paths. However, for internal paths, the logic gates lie between two latches and the latches are completely contained within one child unit. A latch is used as a data storage element and the data stored can be used for storage of signal state. When a latch is used in a circuit, the output and next state depend on the current input and also on its current state, which is dependent on previous inputs. A latch is also used for counting pulses and for synchronizing variably-timed input signals to some reference timing signal. This synchronization enables engineers to make these accurate timing predictions. Furthermore, when two latches are completely contained within a child unit, the timing predictions of the logic path between the contained latches are completely known to the child unit. Thus, propagation delay and slack time are known between the latches when looking exclusively at the child unit. Slack time is the difference between the actual propagated arrival time of a signal and the required arrival time. The required time is typically defined by the arrival of a clock signal at the storage elements. A positive slack margin time indicates the signal arrives in time to be correctly sampled. A negative slack margin indicates the signal arrives too late, where the state of the signal is unknown and the circuit can act in unpredictable ways and may lead to system failure. Therefore, changes to the integrated circuit can be made if these changes do not cause the propagation delay to exceed the required time and produce negative slack time.

Boundary paths, on the other hand, have one latch that lies in one child unit and a latch that lies in a separate child unit. So, the logic gates that lie along a boundary path lie between two latches that exist in different child units. Thus, the timing predictions of the boundary paths are not completely known to an individual child unit. Therefore, changes made to the logic gates along the boundary path may cause the propagation delay to exceed the slack time and make the signal fall into metastability and cause system failure.

Hierarchical design also includes a parent unit. The parent unit contains instances of the child units and paths or connections between those child units. The parent unit does not directly contain information about the contents of the children. A full analysis of the design would include the contents of the parent and each of its children. However, to avoid the problem encountered by flat design methodology, where the time needed to load and simulate the execution of the integrated circuit was a burden, abstraction techniques can be used. Abstract representations, also referred to herein as abstract models or simply abstracts, of the child units are created which contain a reduced set of information. An analysis of the parent unit with abstract models of the children can substitute for analysis of the full design. Because the child unit has complete information of the internal paths, it is only necessary for the abstracted child unit to have complete information of the boundary paths.

To enable one to confirm that the timing requirements are met and avoid the cumbersome simulation of the entire integrated circuit design, an abstract of the integrated circuit design is created that includes the boundary paths and all the logic gates that lie along the boundary paths and leaves out the internal paths and their logic circuitry. Thus, all the latches along the boundary paths are contained within the parent unit and the parent unit has all of the information regarding the propagation delay and the slack time along the boundary paths. Therefore, any timing violations caused during previous integrated circuit design enhancements or processes on the child unit can be seen from either the child unit exclusively, if the process was done on an internal path, or the parent unit exclusively, if the process was done on a boundary path.

With the ever increasing complexity of integrated circuit design and the number of logic gates and other logic circuitry elements that can be implemented on a single SOC, the reevaluation of the timing requirements in the parent unit has become an increasingly burdensome task. Conventional approaches may fail to accommodate the growing necessity individuals or teams have for a way they can administer enhancement techniques or processes on an integrated circuit and not have a negative effect on the timing requirements. Therefore, a need exists in the art for a process to analyze boundary paths during optimization and other modifications to the design.

In this detailed description, reference is made to the accompanying drawings, which illustrate example embodiments. It is to be understood that other embodiments may be utilized and structural changes may be made without departing from the scope of the invention.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises' and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of embodiments of the invention, methods, systems, and computer program products are provided for analyzing boundary paths during optimization on a hierarchical design of an integrated circuit chip.

Flow diagram 100 in FIG. 1 is a high-level flow diagram illustrating an example embodiment of a method for analyzing timing requirements of a hierarchical integrated circuit design. At step 110, an abstract generation process is initiated for the design. Any commercial or proprietary tool for abstract generation may be used, and many commercial EDA tools are available. During the abstract generation process, the tool identifies which logic gates in the design should be retained for the abstract and which logic gates should not be retained. In example method 100, after the tool has identified which logic gates should be retained, those logic gates are marked or otherwise identified. Note, it may not be necessary for the abstraction process to actually create an abstract. It is the process by which the tool determines which logic gates should be retained that is important.

To prepare for step 120, in which an optimization or other modification process will be performed, the marked logic gates are hidden at step 115. The method used to hide the marked logic gates depends on how the process from step 120 functions. Any commercial or proprietary tool for optimization may be used in step 120, and many commercial optimization tools are available. In example flow diagram 100, because the optimization process from step 120 is configured to inspect a particular bit associated with the logic gate when determining whether to modify the logic gate, that particular bit is set for each marked logic gate to "hide" them from the optimization process. A logic gate hidden from the optimization process will not be modified by the optimization process. A logic gate hidden from the optimization process may, however, be seen by the optimization process.

At step 120, the optimization process or other process with the ability to modify logic gates is run. The optimization process may be, for example, a power optimization process, and may replace high power logic gates with low power logic gates. The optimization process will not delete, change, or otherwise modify any logic gate when that logic gate's associated hide bit is set. Hide bits may be associated with logic gates through a data structure, for example a netlist. The netlist or other data structure may associate one or more keywords with logic gates. Individual bits in a particular keyword may be used by the optimization process when performing various tasks, and one bit in particular may be used as the hide bit. After the optimization has completed at step 120, the hide bits that were previously set in step 115 are cleared in step 125. Although example method 100 describes setting hide bits on the logic gates with an abstract keyword and running an optimization process on the integrated circuit design, this is for illustration purposes only and embodiments may have other processes that can be run while the logic gates with an abstract keyword have a hide bit set on them. Also, embodiments for analyzing timing requirements of a hierarchical integrated circuit design may not perform each step shown in example 100, may perform some or all of the steps in a different order, or may perform additional steps not shown. Furthermore, embodiments may combine several steps or expand individual steps into multiple steps.

Figure 2:
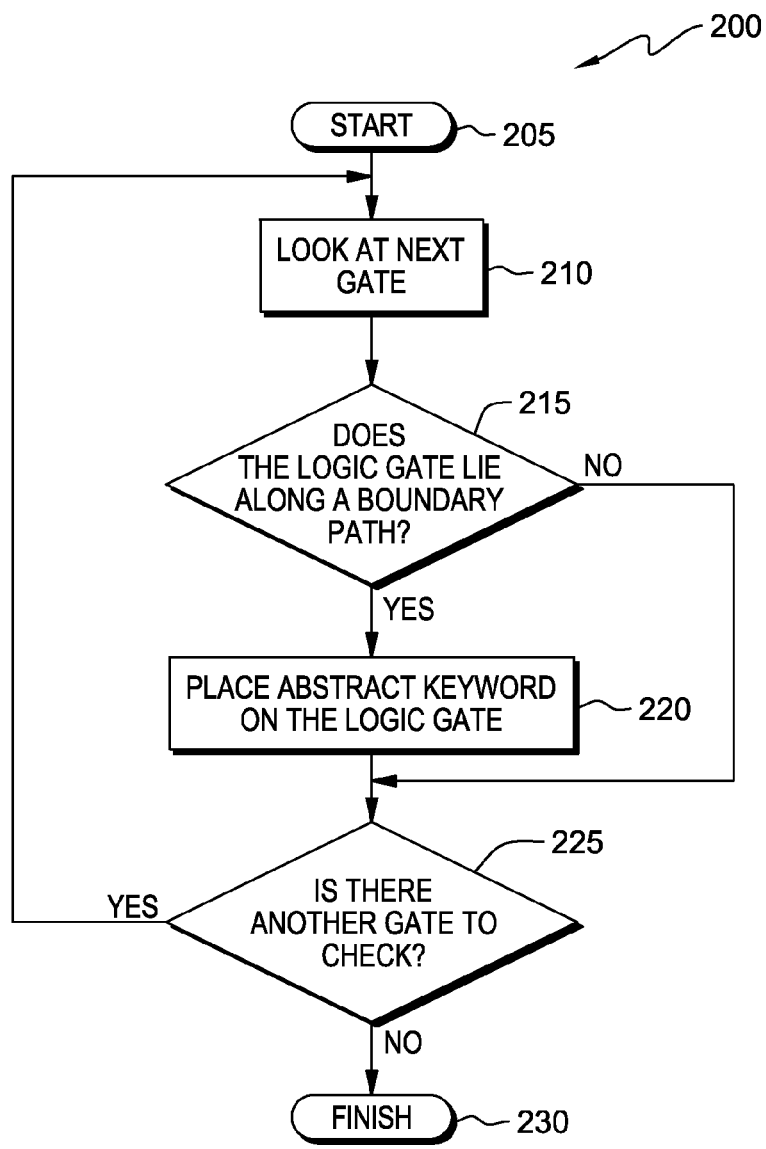
FIG. 2 is a more detailed flow diagram for an example method for running an abstraction process to mark logic gates which are to be retained in an abstract model of the child unit.

Flow diagram 200 in FIG. 2 is a more detailed flow diagram illustrating an example embodiment of a method of running an abstraction process to mark logic gates which are to be retained in an abstract model of the child unit. At step 210, the abstraction process looks at a logic gate in a child unit of the integrated circuit design. At step 215, the abstraction process determines whether the logic gate lies along a boundary path. If the logic gate lies along the boundary path, the logic gate will be retained for the abstract model of the child unit of the integrated circuit design. One example of determining if the logic gate lies along the boundary path is for the abstraction process to determine if the logic gate lies between two latches that exist in the same child unit. If the logic gate lies between two latches that do not exist in the same child unit, the abstraction process places a keyword on the logic gate 220. For example, the abstraction process may access the integrated circuit design netlist. Within the netlist is a description of the components that exist in the integrated circuit design. This includes logic gates, their pins, the wires or nets that are connected to each pin, logic gates that are connected to other logic gates by these nets, the types of nets connecting the logic gates, keywords, etc. The abstract keyword is a particular type of keyword that exists in the netlist and causes an operation to be performed upon a component in the integrated circuit design. In this case, the abstract keyword causes an operation to be performed upon a logic gate that lies along the boundary path. When the abstract keyword is placed on the logic gate, the logic gate is copied and the copy is placed into an integrated circuit design abstract database. If the logic gate lies between two latches that exist in the same child unit, the abstraction process does not place a keyword on the logic gate.

The abstraction process iterates through each logic gate in the child unit and places all the logic gates that lie along a boundary path in the integrated circuit design abstract database. To do this, at step 225, the abstraction process determines whether there is another logic gate that it needs to check to see if it will be retained in the abstract model of the child unit. One example of accomplishing this is for the abstraction process to account for the number of logic gates it has previously checked and see if that number is equivalent to the number of logic gates that exist in that child unit. If the number of logic gates checked is not equivalent to the total number of logic gates that exist in the child unit then, the abstraction process continues the process of marking logic gates which are to be retained in the abstract model of the child unit.

Although example method 200 describes the abstraction process checking whether the logic gate lies along the boundary path by determining whether the logic gate lies between two latches that exist in the same child unit 215 and then placing them in an integrated circuit design abstract database, and determines if there are any other logic gates to check based upon the equivalence of the logic gates already checked and the number of logic gates that exist in the child unit 225, these determinations are for illustration purposes only. Embodiments may use other techniques for determining whether the logic gate lies along the boundary path or whether there are any other logic gates to check. Also, embodiments for running an abstraction process to mark logic gates which are to be retained in an abstract may not perform each step shown in example 200, may perform some or all of the steps in a different order, or may perform additional steps not shown. Furthermore, embodiments may combine several steps or expand individual steps into multiple steps.

Figure 3:
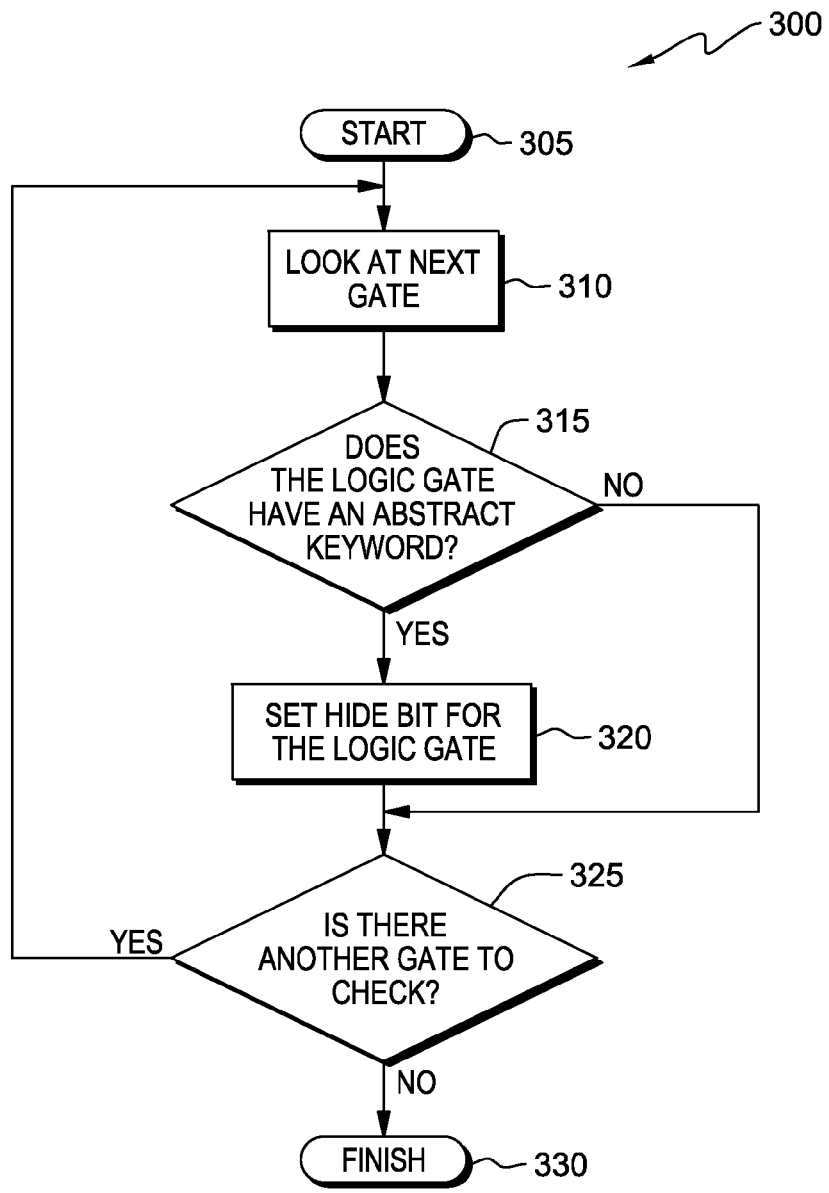
FIG. 3 is a more detailed flow diagram for an example method for setting hide bits on logic gates with keywords that show which logic gates would be in the parent unit.

Flow diagram 300 in FIG. 3 is a more detailed flow diagram illustrating an example embodiment of a method of setting hide bits on logic gates with keywords that show which logic gates would be in the abstract model of the child unit. At step 310, the method looks at a logic gate in the child unit of the integrated circuit design. At step 315, the method determines whether the logic gate has an abstract keyword. One example of accomplishing this is for the method to determine if the logic gate is placed in the integrated circuit design abstract database by the abstraction process with the use of the abstract keyword. If the logic gate exists in the integrated circuit abstract database, the method accesses the integrated circuit design netlist. As previously stated, the netlist is a description of the components that exist in the integrated circuit design, this includes logic gates and keywords. The "hide" keyword is a particular type of keyword that exists in the netlist and causes an operation to be performed on upon a component in the integrated circuit design. In this case, the "hide" keyword causes an operation to be performed upon a logic gate that exists in the integrated circuit design abstract database. The "hide" keyword is present in the logical description of the logic gate, however, a bit must be set to turn the "hide" keyword on 320. If the hide bit is set, the "hide" keyword will signal to an optimization or modification process to not alter the logic gate. If the logic gate does not exist in the database, the method does not set a hide bit on the logic gate.

In this example, the "hide" keyword is necessary because the logic gate's hide bit is set in preparation for an optimization or modification process to be run on the integrated circuit design. Although the logic gates with the abstract keyword placed on them are the same logic gates with the "hide" keyword turned on, the optimization or modification process does not recognize the abstract keyword as a signal not to alter the logic gate. Therefore, the "hide" keyword is turned on to protect the logic gate from alteration by the optimization or modification process.

At step 325, the method determines whether there is another logic gate that needs to be checked to see if it has an abstract keyword and needs a hide bit set on it. One example of accomplishing this is for the method to account for the number of logic gates it has previously checked and see if that number is equivalent to the number of logic gates that exist in that child unit. If the number of logic gates checked is not equivalent to the total number of logic gates that exist in the child unit, then the method continues the process of setting hide bits on logic gates with abstract keywords.

Although example method 300 describes the process of checking whether the abstraction process placed the logic gate in a database with an abstract keyword 315 and determines if there are any other logic gates to check based upon the equivalence of the logic gates already checked and the number of logic gates that exist in the child unit 325, these are for illustration purposes only. Embodiments may use other techniques for determining whether the logic gate has an abstract keyword or whether there are any other logic gates to check. Also, embodiments for setting hide bits on logic gates with abstract keywords may not perform each step shown in example 300, may perform some or all of the steps in a different order, or may perform additional steps not shown. Furthermore, embodiments may combine several steps or expand individual steps into multiple steps.

Figure 4:
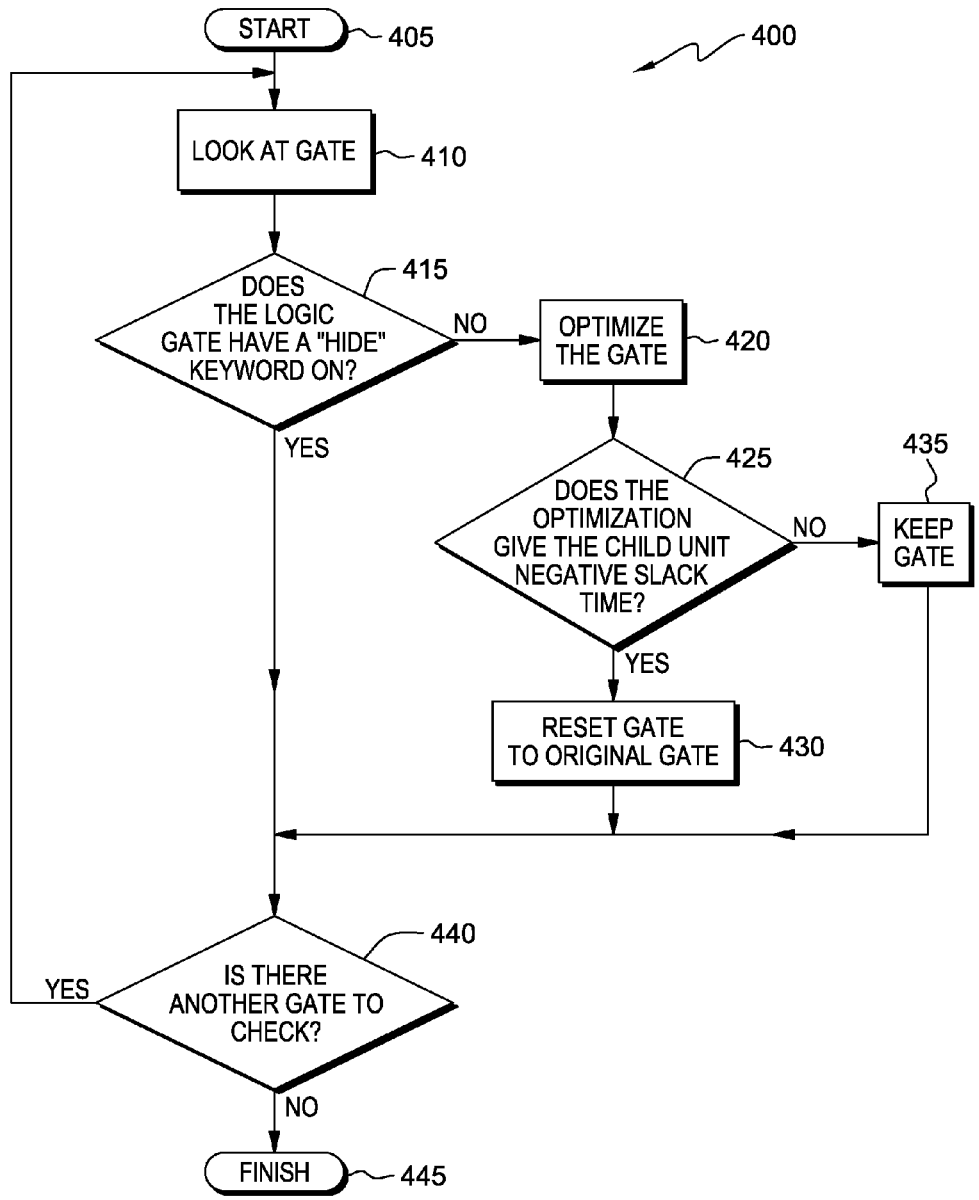
FIG. 4 is a more detailed flow diagram for an example method for running an optimization process on the logic gates in the child unit in an integrated circuit design.

Flow diagram 400 in FIG. 4 is a more detailed flow diagram illustrating an example embodiment of a method of running an optimization or other modification process on the logic gates in a child unit in an integrated circuit design. At step 410, the optimization process looks at a logic gate in the child unit of the integrated circuit design. At step 415, the optimization process determines whether the logic gate has a "hide" keyword on. If the "hide" keyword is on, the optimization process does not optimize the logic gate. If the "hide" keyword is off, the optimization process optimizes the logic gate at step 420. Any commercial or proprietary tool for optimization may be used, and there are many optimization tools available. Examples of optimization processes include size, cost, and power optimization. For example, power optimization may involve replacing high power logic gates with low power logic gates. The substitution of the lower power logic gates enables the integrated circuit to perform the identical task as the original integrated circuit, but driven by less power. In another example, cost optimization entails replacing expensive logic gates with logic gates that are less expensive to manufacture. This substitution allows the changed integrated circuit to perform the same task as the original integrated circuit, but using the less expensive logic gates.

At step 425 the optimization timing tool checks whether the optimization of the logic gate produces negative slack time in the child unit. One example of accomplishing this is for the optimization timing tool to compare the allowed slack time with the propagation delay caused by the replacing of the logic gate. For example, a signal path has a slack time of 0.5 microseconds and a logic gate is found to not have its "hide" keyword on. The process replaces the logic gate with a lower powered logic gate and the power optimization timing tool checks to see if the propagation delay of the signal is increased 0.5 microseconds because of the logic gate replacement. At step 430, the delay of the propagation of the signal is increased by more than 0.5 microseconds, which is greater than the slack time and causes negative slack time. Therefore, the logic gate is reset to the original logic gate.

At step 435, the delay of the propagation of the signal is increased by less than 0.5 microseconds, which is less than the slack time and does not cause negative slack time. Therefore, the logic gate substitution is kept. At step 440, the optimization process determines whether there is another logic gate that may be optimized in the child unit of the integrated circuit design. One example of accomplishing this is for the optimization process to account for the number of logic gates it has previously checked and see if that number is equivalent to the number of logic gates that exist in that child unit. If the number of logic gates checked is not equivalent to the total number of logic gates that exist in the child unit, then the optimization process continues the process of optimizing the logic gates in the child unit.

Although example method 400 describes the optimization process checking if a "hide" keyword is on 415, and determines whether the logic gate replacement causes negative slack time by comparing the increase in propagation delay with slack time 425, and determines if there are any other logic gates to check based upon the equivalence of the logic gates already checked and the number of logic gates that exist in the child unit 440, these determinations are for illustration purposes only. Embodiments may use other techniques for determining whether the logic gate has a "hide" keyword on, or whether the replacement of the logic gate causes negative slack time, or whether there are any other logic gates to check. Also, embodiments for running an optimization process on the logic gates in the child unit in an integrated circuit design may not perform each step shown in example 400, may perform some or all of the steps in a different order, or may perform additional steps not shown. Furthermore, embodiments may combine several steps or expand individual steps into multiple steps.

Figure 5:
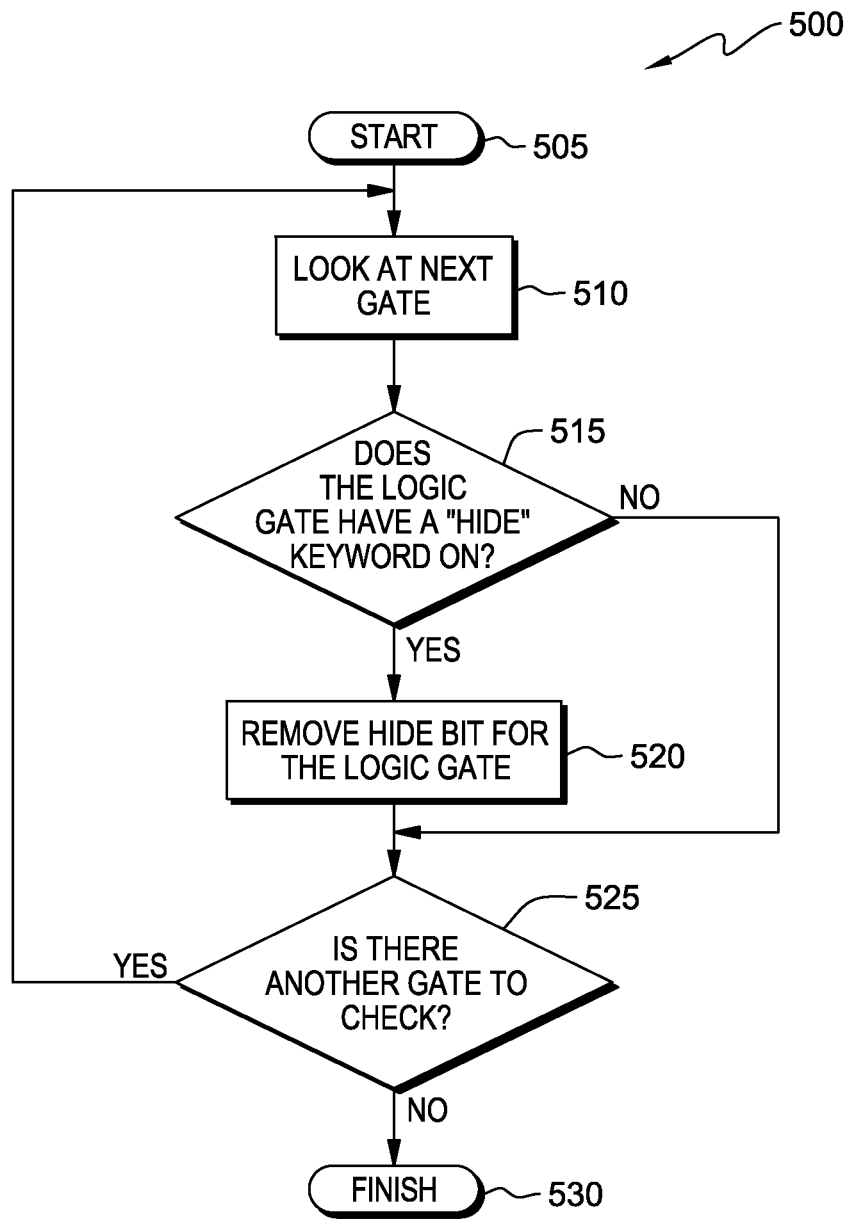
FIG. 5 is a more detailed flow diagram for an example method for removing the hide bit from the logic gate.

Flow diagram 500 in FIG. 5 is a more detailed flow diagram illustrating an example embodiment of a method of removing the hide bit from the logic gate. At step 510, the method looks at the logic gate in the child unit of the integrated circuit design. At step 515, the method determines whether the logic gate has a "hide" keyword set. One example of accomplishing this is for the method to check if the logic gate is placed in the integrated circuit design abstract database by the abstraction process with the use of the abstraction keyword. If the logic gate exists in the integrated circuit abstract design database, the method accesses the integrated circuit design netlist. As previously stated, the netlist is a description of all the components that exist in the integrated circuit design, this includes logic gates and keywords. The "hide" keyword is a particular type of keyword that exists in the netlist and causes an operation to be performed upon a component in the integrated circuit design. In this case, the "hide" keyword causes an operation to be performed upon a logic gate that exists in the integrated circuit design abstract database. The "hide" keyword is present in the logical description of the logic gate, however, a bit must be cleared to turn the "hide" keyword off. The method removes the hide bit 520, turning the "hide" keyword off and the logic gate no longer has the "hide" keyword protecting it from optimization or modification processes. If the logic gate does not exist in the database, the method ignores the logic gate.

At step 525, the method determines whether there is another logic gate that needs to be checked to determine if a hide bit needs to be removed. One example of accomplishing this is for the method to account for the number of logic gates it has previously checked and see if that number is equivalent to the number of logic gates that exist in that child unit. If the number of logic gates checked is not equivalent to the total number of logic gates that exist in the child unit, then the method continues the process of removing the hide bit from the logic gate.

Although example method 500 describes the method of determining whether a logic gate has a "hide" keyword on 515 by checking whether the abstraction process placed the logic gate in the integrated circuit design abstract database with an abstraction keyword and determines if there are any other logic gates to check 525 based upon the equivalence of the logic gates already checked and the number of logic gates that exist in the child unit, these determinations are for illustration purposes only and may not reflect the actual methods used. Embodiments may use other techniques for determining whether a logic gate has a "hide" keyword on, or whether there are any other logic gates to check. Also, embodiments for removing the hide bit from the logic gate 500, may perform some or all of the steps in a different order, or may perform additional steps not shown. Furthermore, embodiments may combine several steps or expand individual steps into multiple steps.

Figure 6:
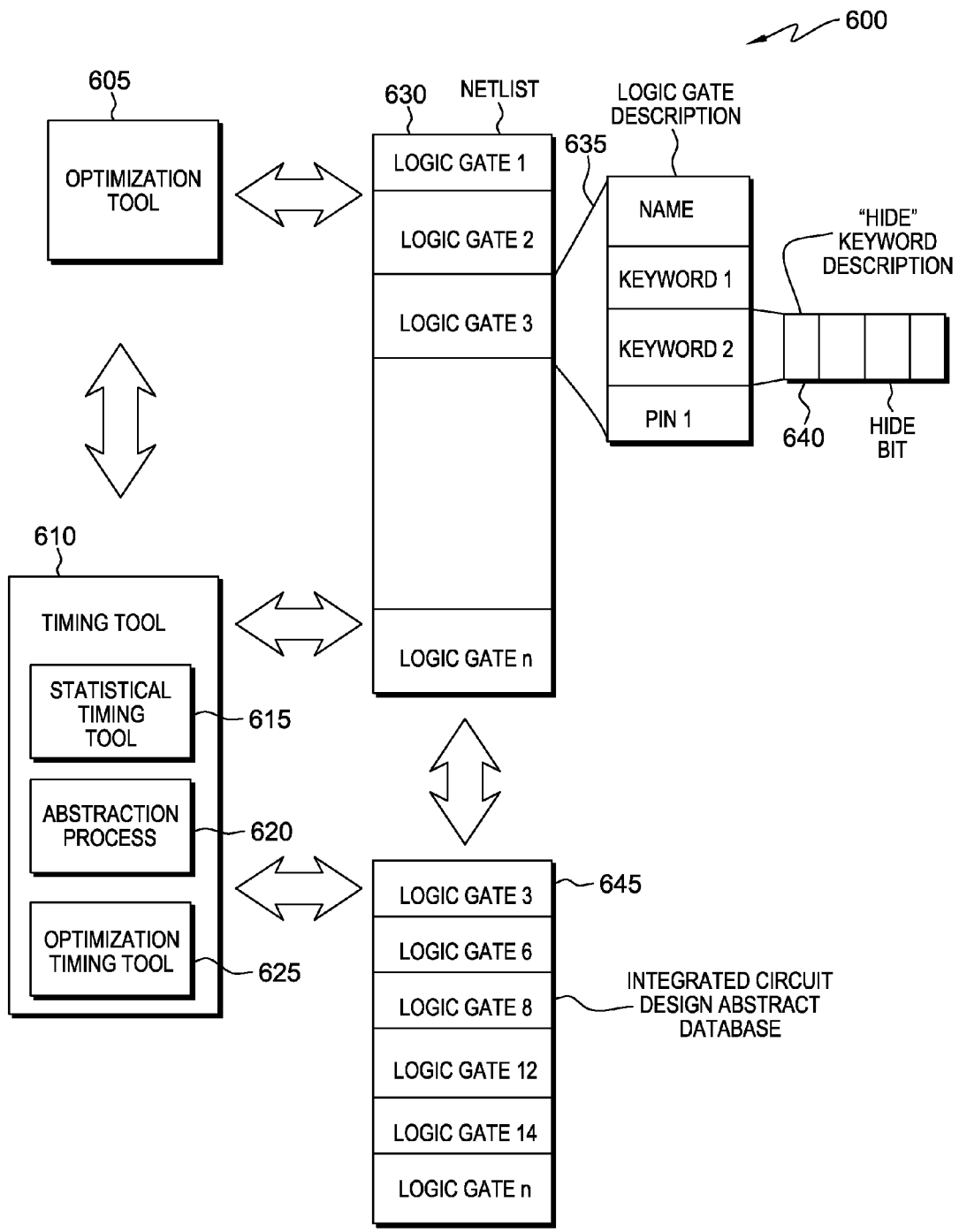
FIG. 6 is a simplified high level diagram of one embodiment of a system using a timing tool and an optimization tool, in accordance with the present invention.

Example 600 in FIG. 6 shows an example system for analyzing timing requirements of a hierarchical integrated circuit design.

Initially the timing tool 610 may have a complete description of a child unit of the hierarchical integrated circuit design. In this example, within the timing tool 610 is a statistical timing tool 615. The statistical timing tool 615 may receive the child unit of the hierarchical integrated circuit design and processes the estimated signal propagation along each path in the child unit. The statistical timing tool 615 may also process the slack time along each path in the child unit. The statistical timing tool 615 may find the difference between the signal propagation and the slack time along each path, therefore, determining which paths have a negative slack time.

In this example, the complete description of the integrated circuit design may be observed in the netlist 630. Within the netlist 630 are logic gates of the child unit, their pins, the wires or nets that are connected to each pin, logic gates that are connected to other logic gates by these nets, the types of nets connecting the logic gates, keywords, etc. In this example, within the timing tool 610, is the abstraction process 620. The abstraction process 620 may determine from the netlist 630 which logic gates lie along a boundary path in the child unit. For a logic gate that lies along a boundary path, the abstraction process may access the logic gate description 635 and may place a keyword, in this case, the abstract keyword, in the logic gate description 635. The abstraction process may record the logic gates that will be retained for the abstract model of the child unit, may make a copy of these logic gates, and may place them in the integrated circuit design abstract database 645.

In this example, the integrated circuit design abstract database 645 may be accessed. The logic gates that exist in the netlist 630 may be compared with the logic gates that exist in the integrated circuit design abstract database 645, and this comparison may determine which logic gates may be checked for another keyword in the logic gate description 635, in this case, the "hide" keyword. The hide bit may be set in the "hide" keyword description 640, turning the "hide" keyword on. Setting the hide bit enables the "hide" keyword to take effect.

In this example, the optimization tool 605 may access the netlist 630 and examine a logic gate. The optimization tool 605 may optimize the logic gate if the logic gate's "hide" keyword is not set and may not optimize the logic gate if the logic gate's "hide" keyword is set. In this example, the optimization timing tool 625 may check if the optimization creates negative slack, and therefore causes a timing violation.

In this example, the netlist 630 may be accessed to find which logic gates have their "hide" keyword on. For the logic gates with their "hide" keyword on, the "hide" keyword description 640 may be accessed and their hide bit may be changed so the hide bit is no longer set, turning the "hide" keyword off. Turning the "hide" keyword off eliminates the effects of the "hide" keyword from each logic gate.

Figure 7:
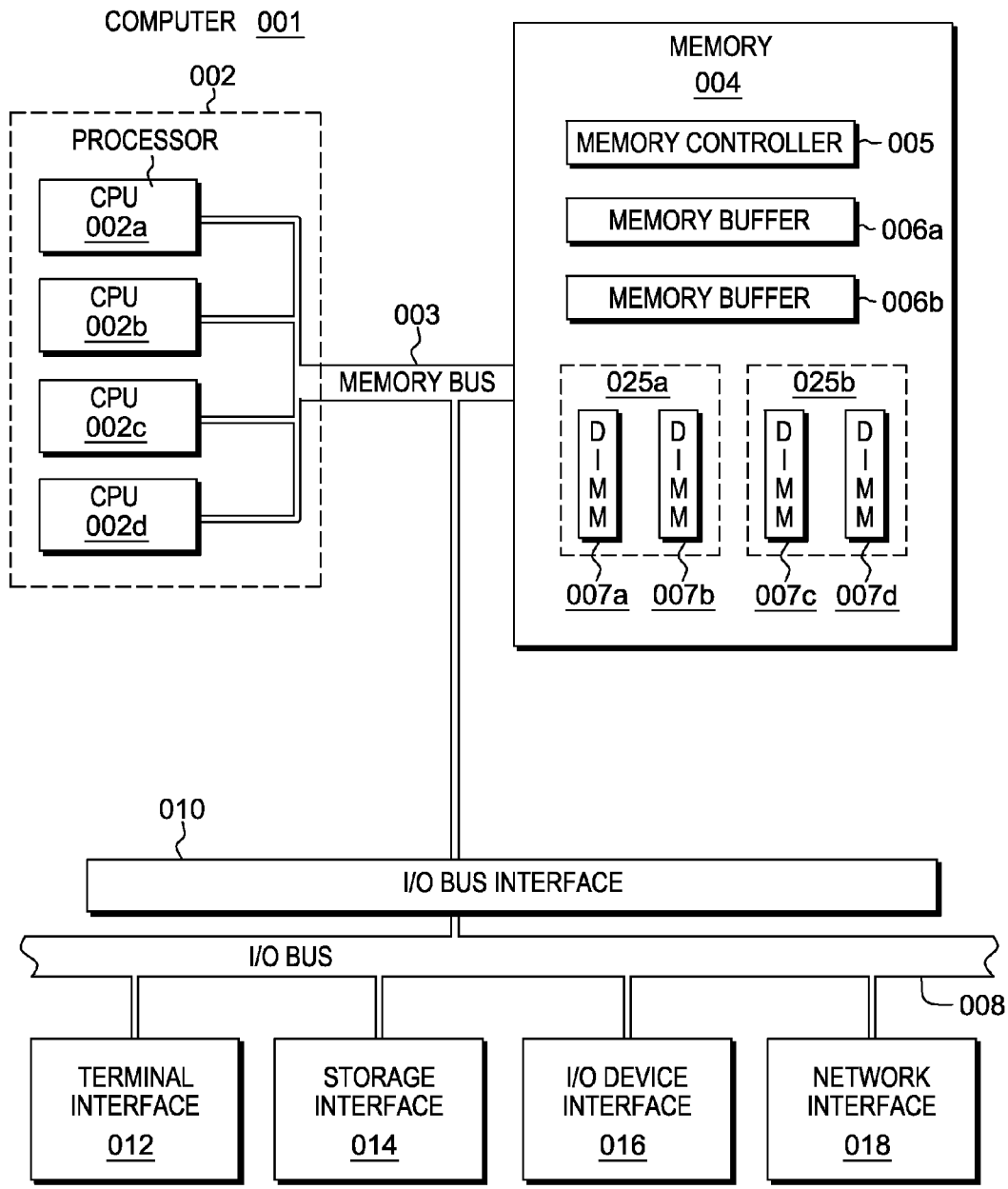
FIG. 7 depicts a high-level block diagram of an example system according to an embodiment of the invention.

FIG. 7 depicts a high-level block diagram of an example system for implementing an embodiment. The mechanisms and apparatus of embodiments of the present invention apply equally to any appropriate computing system. The major components of the computer system 001 comprise one or more CPUs 002, a memory subsystem 004, a terminal interface 012, a storage interface 014, an I/O (Input/Output) device interface 016, and a network interface 018, all of which are communicatively coupled, directly or indirectly, for inter-component communication via a memory bus 003, an I/O bus 008, and an I/O bus interface unit 010.

The computer system 001 may contain one or more general-purpose programmable central processing units (CPUs) 002A, 002B, 002C, and 002D, herein generically referred to as the CPU 002. In an embodiment, the computer system 001 may contain multiple processors typical of a relatively large system; however, in another embodiment the computer system 001 may alternatively be a single CPU system. Each CPU 002 executes instructions stored in the memory subsystem 004 and may comprise one or more levels of on-board cache.

In an embodiment, the memory subsystem 004 may comprise a random-access semiconductor memory, storage device, or storage medium (either volatile or non-volatile) for storing data and programs. In another embodiment, the memory subsystem 004 may represent the entire virtual memory of the computer system 001, and may also include the virtual memory of other computer systems coupled to the computer system 001 or connected via a network. The memory subsystem 004 may be conceptually a single monolithic entity, but in other embodiments the memory subsystem 004 may be a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The main memory or memory subsystem 004 may contain elements for control and flow of memory used by the CPU 002. This may include all or a portion of the following: a memory controller 005, one or more memory buffer 006 and one or more memory devices 007. In the illustrated embodiment, the memory devices 007 may be dual in-line memory modules (DIMMs), which are a series of dynamic random-access memory (DRAM) chips 015a-015n (collectively referred to as 015) mounted on a printed circuit board and designed for use in personal computers, workstations, and servers. The use of DRAMs 015 in the illustration is exemplary only and the memory array used may vary in type as previously mentioned. In various embodiments, these elements may be connected with buses for communication of data and instructions. In other embodiments, these elements may be combined into single chips that perform multiple duties or integrated into various types of memory modules. The illustrated elements are shown as being contained within the memory subsystem 004 in the computer system 001. In other embodiments the components may be arranged differently and have a variety of configurations. For example, the memory controller 005 may be on the CPU 002 side of the memory bus 003. In other embodiments, some or all of them may be on different computer systems and may be accessed remotely, e.g., via a network.

Although the memory bus 003 is shown in FIG. 7 as a single bus structure providing a direct communication path among the CPUs 002, the memory subsystem 004, and the I/O bus interface 010, the memory bus 003 may in fact comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 010 and the I/O bus 008 are shown as single respective units, the computer system 001 may, in fact, contain multiple I/O bus interface units 010, multiple I/O buses 008, or both. While multiple I/O interface units are shown, which separate the I/O bus 008 from various communications paths running to the various I/O devices, in other embodiments some or all of the I/O devices are connected directly to one or more system I/O buses.

In various embodiments, the computer system 001 is a multi-user mainframe computer system, a single-user system, or a server computer or similar device that has little or no direct user interface, but receives requests from other computer systems (clients). In other embodiments, the computer system 001 is implemented as a desktop computer, portable computer, laptop or notebook computer, tablet computer, pocket computer, telephone, smart phone, network switches or routers, or any other appropriate type of electronic device.

FIG. 7 is intended to depict the representative major components of an exemplary computer system 001. But individual components may have greater complexity than represented in FIG. 7, components other than or in addition to those shown in FIG. 7 may be present, and the number, type, and configuration of such components may vary. Several particular examples of such complexities or additional variations are disclosed herein. The particular examples disclosed are for example only and are not necessarily the only such variations.

The memory buffer 006, in this embodiment, may be intelligent memory buffer, each of which includes an exemplary type of logic module. Such logic modules may include hardware, firmware, or both for a variety of operations and tasks, examples of which include: data buffering, data splitting, and data routing. The logic module for memory buffer 006 may control the DIMMs 007, the data flow between the DIMM 007 and memory buffer 006, and data flow with outside elements, such as the memory controller 005. Outside elements, such as the memory controller 005 may have their own logic modules that the logic module of memory buffer 006 interacts with. The logic modules may be used for failure detection and correcting techniques for failures that may occur in the DIMMs 007. Examples of such techniques include: Error Correcting Code (ECC), Built-In-Self-Test (BIST), extended exercisers, and scrub functions. The firmware or hardware may add additional sections of data for failure determination as the data is passed through the system. Logic modules throughout the system, including but not limited to the memory buffer 006, memory controller 005, CPU 002, and even the DRAM 0015 may use these techniques in the same or different forms. These logic modules may communicate failures and changes to memory usage to a hypervisor or operating system. The hypervisor or the operating system may be a system that is used to map memory in the system 001 and tracks the location of data in memory systems used by the CPU 002. In embodiments that combine or rearrange elements, aspects of the firmware, hardware, or logic modules capabilities may be combined or redistributed. These variations would be apparent to one skilled in the art.

Embodiments described herein may be in the form of a system, a method, or a computer program product. Accordingly, aspects of embodiments of the invention may take the form of an entirely hardware embodiment, an entirely program embodiment (including firmware, resident programs, micro-code, etc., which are stored in a storage device) or an embodiment combining program and hardware aspects that may all generally be referred to herein as a "circuit," "module," or "system." Further, embodiments of the invention may take the form of a computer program product embodied in one or more computer-readable medium(s) having computer-readable program code embodied thereon.

Any combination of one or more computer-readable medium(s) may be utilized. The computer-readable medium may be a computer-readable signal medium or a computer-readable storage medium. A computer-readable storage medium, may be, for example, but not limited to, an electronic, magnetic, optical, electromagnetic, infrared, or semiconductor system, apparatus, or device, or any suitable combination of the foregoing. More specific examples (an non-exhaustive list) of the computer-readable storage media may comprise: an electrical connection having one or more wires, a portable computer diskette, a hard disk, a random access memory (RAM), a read-only memory (ROM), an erasable programmable read-only memory (EPROM) or Flash memory, an optical fiber, a portable compact disc read-only memory (CD-ROM), an optical storage device, a magnetic storage device, or any suitable combination of the foregoing. In the context of this document, a computer-readable storage medium may be any tangible medium that can contain, or store, a program for use by or in connection with an instruction execution system, apparatus, or device.

A computer-readable signal medium may comprise a propagated data signal with computer-readable program code embodied thereon, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that communicates, propagates, or transports a program for use by, or in connection with, an instruction execution system, apparatus, or device. Program code embodied on a computer-readable medium may be transmitted using any appropriate medium, including but not limited to, wireless, wire line, optical fiber cable, Radio Frequency, or any suitable combination of the foregoing.

Embodiments of the invention may also be delivered as part of a service engagement with a client corporation, non-profit organization, government entity, or internal organizational structure. Aspects of these embodiments may comprise configuring a computer system to perform, and deploying computing services (e.g., computer-readable code, hardware, and web services) that implement, some or all of the methods described herein. Aspects of these embodiments may also comprise analyzing the client company, creating recommendations responsive to the analysis, generating computer-readable code to implement portions of the recommendations, integrating the computer-readable code into existing processes, computer systems, and computing infrastructure, metering use of the methods and systems described herein, allocating expenses to users, and billing users for their use of these methods and systems. In addition, various programs described hereinafter may be identified based upon the application for which they are implemented in a specific embodiment of the invention. But, any particular program nomenclature that follows is used merely for convenience, and thus embodiments of the invention are not limited to use solely in any specific application identified and/or implied by such nomenclature. The exemplary environments are not intended to limit the present invention. Indeed, other alternative hardware and/or program environments may be used without departing from the scope of embodiments of the invention.

While the invention has been described with reference to the specific aspects thereof, those skilled in the art will be able to make various modifications to the described aspects of the invention without departing from the true spirit and scope of the invention. The terms and descriptions used herein are set forth by way of illustration only and are not meant as limitations. Those skilled in the art will recognize that these and other variations are possible within the spirit and scope of the invention as defined in the following claims and their equivalents.

What is claimed is:

1. A computer-implemented method for analyzing timing requirements of a hierarchical integrated circuit design having a plurality of child units, the method comprising:
   accessing a netlist having a plurality of logic gates of a child unit from the plurality of child units;
   determining a set of logic gates are members of both the plurality of logic gates of the child unit and a plurality of logic gates of an abstract model of the child unit;
   marking the set of logic gates, based on the determination, such that an integrated circuit modification process recognizes the set of logic gates;
   executing the integrated circuit modification process on the child unit, such that at least one logic gate from the child unit is changed;
   preserving the set of marked logic gates, in response to the marking, such that the set of logic gates are unchanged by the integrated circuit modification process; and
   generating a new child unit in response to the integrated circuit modification process.

2. The method of claim 1, wherein determining the set of logic gates are members of both the plurality of the child unit and the plurality of logic gates of the abstract model includes:
   initiating an abstract generation process of the hierarchical integrated circuit design;
   selecting the plurality of logic gates of the abstract model based on the abstract generation process; and
   comparing the plurality of logic gates of the child unit against the plurality of logic gates of the abstract model of the child unit.

3. The method of claim 1, wherein a logic gate from the set of logic gates has at least one bit and marking the set of logic gates includes turning on the at least one bit of the logic gate from the set of logic gates.

4. The method of claim 3, further comprising:
   removing the at least one bit of the logic gate from the set of logic gates after the integrated circuit modification process has been executed.

5. The method of claim 1, wherein the integrated circuit modification process is a power optimization process.

6. The method of claim 1, wherein the integrated circuit modification process is executed on the plurality of child units.

7. The method of claim 1, wherein the new child unit includes the set of preserved marked logic gates and the at least one changed logic gate.

8. A system for analyzing timing requirements of a hierarchical integrated circuit design having a plurality of child units, the system comprising:
   a timing tool configured to:
      access a netlist having a plurality of logic gates of a child unit from the plurality of child units,
      determine a set of logic gates are members of both the plurality of logic gates of the child unit and a plurality of logic gates of an abstract model of the child unit,
      mark the set of logic gates, based on the determination, such that an integrated circuit modification process recognizes the set of logic gates, and
      preserve the set of marked logic gates, in response to the marking, such that the set of logic gates are unchanged by the integrated circuit modification process; and
   an optimization tool configured to:
      execute the integrated circuit modification process on the child unit, such that at least one logic gate from the child unit is changed, and
      generate a new child unit in response to the integrated circuit modification process.

9. The system of claim 8, wherein determining the set of logic gates are members of both the plurality of the child unit and the plurality of logic gates of the abstract model includes:
   initiating an abstract generation process of the hierarchical integrated circuit design;
   selecting the plurality of logic gates of the abstract model based on the abstract generation process; and
   comparing the plurality of logic gates of the child unit against the plurality of logic gates of the abstract model of the child unit.

10. The system of claim 8, wherein a logic gate from the set of logic gates has at least one bit and marking the set of logic gates includes turning on the at least one bit of the logic gate from the set of logic gates.

11. The system of claim 10, the timing tool further configured to:
   remove the at least one bit of the logic gate from the set of logic gates after the integrated circuit modification process has been executed.

12. The system of claim 8, wherein the integrated circuit modification process is a power optimization process.

13. The system of claim 8, wherein the integrated circuit modification process is executed on the plurality of child units.

14. The system of claim 8, wherein the new child unit includes the set of preserved marked logic gates and the at least one changed logic gate.

15. A computer program product configured to analyze timing requirements of a hierarchical integrated circuit design having a plurality of child units, the computer program product comprising a computer readable storage medium having program code embodied therewith, the program code comprising computer readable program code configured to:
   access a netlist having a plurality of logic gates of a child unit from the plurality of child units;
   determine a set of logic gates are members of both the plurality of logic gates of the child unit and a plurality of logic gates of an abstract model of the child unit;
   mark the set of logic gates, based on the determination, such that an integrated circuit modification process recognizes the set of logic gates;
   execute the integrated circuit modification process on the child unit, such that at least one logic gate from the child unit is changed;
   preserve the set of marked logic gates, in response to the marking, such that the set of logic gates are unchanged by the integrated circuit modification process; and
   generate a new child unit in response to the integrated circuit modification process, such that the new child unit includes the set of preserved marked logic gates and the at least one changed logic gate.

16. The computer program product of claim 15, wherein determining the set of logic gates are members of both the plurality of the child unit and the plurality of logic gates of the abstract model includes:
   initiate an abstract generation process of the hierarchical integrated circuit design;

selecting the plurality of logic gates of the abstract model based on the abstract generation process; and comparing the plurality of logic gates of the child unit against the plurality of logic gates of the abstract model of the child unit.

17. The computer program product of claim 15, wherein a logic gate from the set of logic gates has at least one bit and marking the set of logic gates includes turning on the at least one bit of the logic gate from the set of logic gates.

18. The computer program product of claim 17, further configured to:

remove the at least one bit of the logic gate from the set of logic gates after the integrated circuit modification process has been executed.

19. The computer program product of claim 15, wherein the integrated circuit modification process is a power optimization process.

20. The computer program product of claim 15, wherein the integrated circuit modification process is executed on the plurality of child units.

\* \* \* \* \*